(12) United States Patent
Koshikawa

(10) Patent No.: US 7,187,607 B2
(45) Date of Patent: Mar. 6, 2007

(54) SEMICONDUCTOR MEMORY DEVICE AND METHOD FOR MANUFACTURING SAME

(75) Inventor: Yasuji Koshikawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 170 days.

(21) Appl. No.: 10/958,572

(22) Filed: Oct. 6, 2004

(65) Prior Publication Data
US 2005/0052928 A1 Mar. 10, 2005

(30) Foreign Application Priority Data
Oct. 9, 2003 (JP) ............... 2003-351250

(51) Int. Cl.
*G11C 7/00* (2006.01)
(52) U.S. Cl. .............. 365/222; 365/200; 365/225.7
(58) Field of Classification Search ........... 365/222, 365/200, 225.7
See application file for complete search history.

(56) References Cited

U.S. PATENT DOCUMENTS 5,644,545 A * 7/1997 Fisch .................. 365/222

FOREIGN PATENT DOCUMENTS

| JP | 02-187987 | 7/1990 |
| JP | 4-10297 | 1/1992 |
| JP | 06089571 | 3/1994 |
| JP | 11250694 | 9/1999 |
| JP | 2001-060400 | 3/2001 |

* cited by examiner

*Primary Examiner*—Huan Hoang
(74) *Attorney, Agent, or Firm*—Whitham, Curtis, Christofferson & Cook, PC

(57) ABSTRACT

At first, failed cells are repaired using row redundancy or column redundancy as done in the past and then, for the remaining failed cells that cannot be repaired by row or column redundancy, by increasing the number of refreshes greater than that of normal cells, it is possible to repair more failed cells.

9 Claims, 10 Drawing Sheets

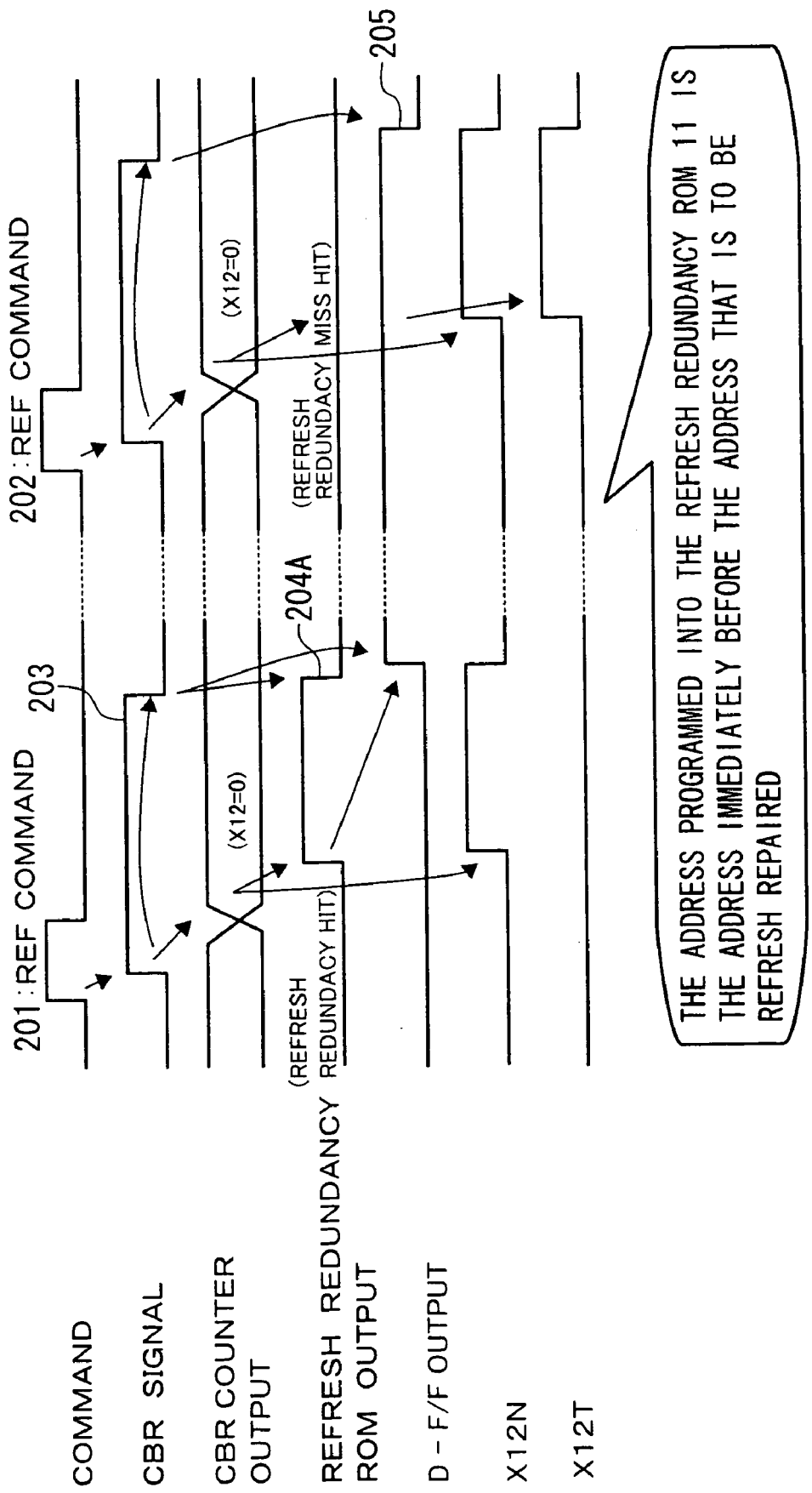

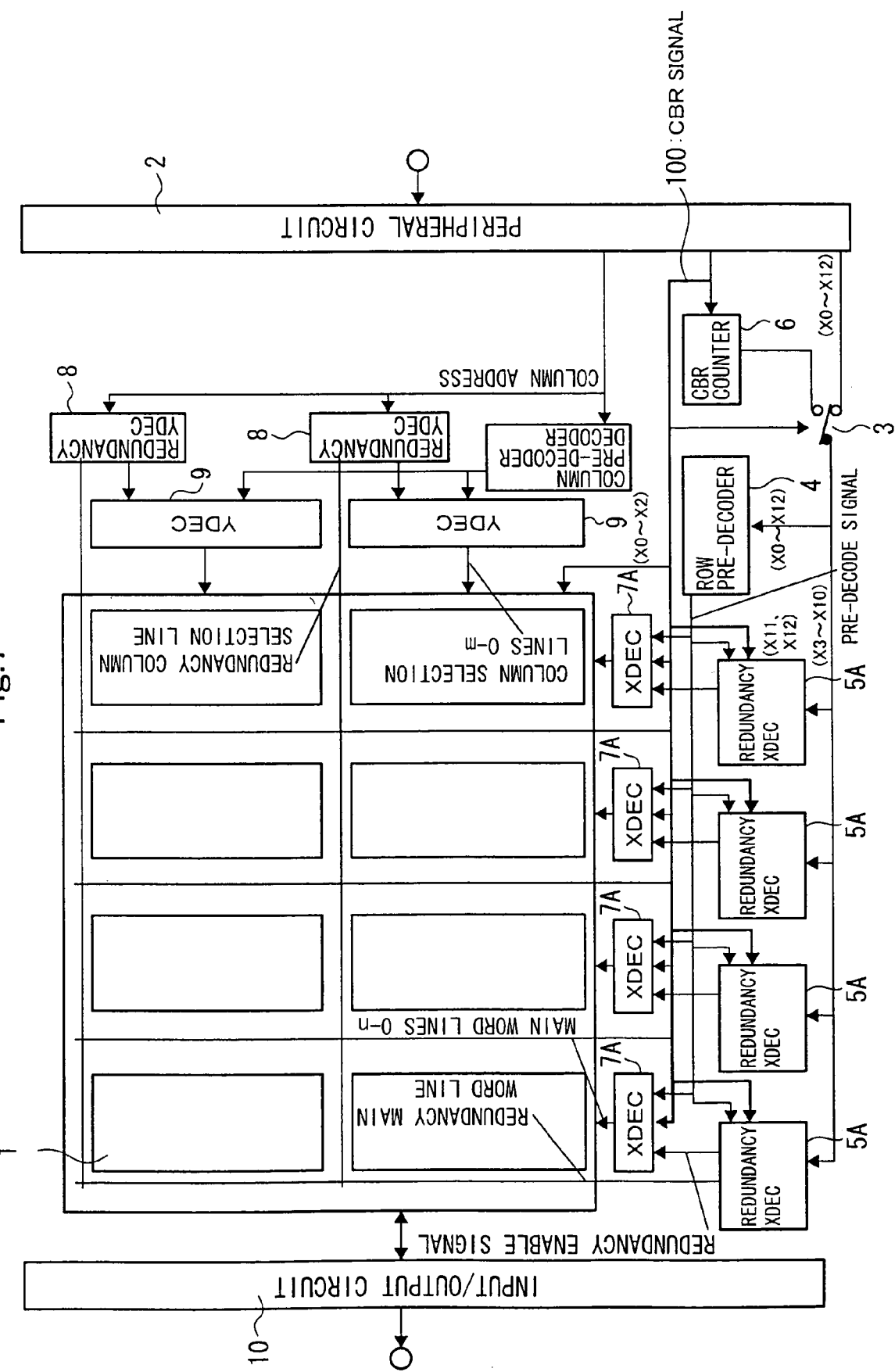

4A5B[H]

CA5B[H]    FAILED CELL

COLUMN REDUNDANCY LINE

ROW REDUNDANCY LINES

SEMICONDUCTOR MEMORY DEVICE AND METHOD FOR MANUFACTURING SAME

BACKGROUND OF THE INVENTION

1. Field of the Invention

The present invention relates to a semiconductor memory device and to a method for manufacturing same. More particularly, it relates to a semiconductor memory device having redundant cells, in which failed cells are repaired using row redundancy or column redundancy of the prior art, and further in which remaining failed cells not repairable using row redundancy or column redundancy are repaired by increasing the number of refreshes thereby repairing these cells and increasing manufacturing yield.

2. Related Art

FIG. 11 of the accompanying drawings is a conventional block diagram showing the configuration of a semiconductor memory device.

In FIG. 11, the reference numeral 1 denotes a memory array, 2 is a peripheral circuit, 3 is a switch, 4 is a row pre-decoder, 5 is a redundant X decoder, and 6 is a CBR counter, this semiconductor memory device in FIG. 11 is provided with a plurality of separated segments which serve as repair units (in the drawing, a row has 4 segments and a column has 2 segments).

A row address generated by the peripheral circuit 2 is input to a switch 3. The output of the switch 3 is input to the row pre-decoder 4 and the redundant X decoders 5. At the time of input of an active command for the purpose of writing into or reading from the memory cell 1, a row address output from the peripheral circuit 2 is input to the row pre-decoder 4 and the redundant X decoder 5 via the switch 3.

At the time of input of a refresh command for the purpose of performing a refresh operation, an internal address counted up within the CBR counter 6, based on a CBR signal generated in accordance with a refresh command, is input to the row pre-decoder 4 and the redundant X decoder 5 via the switch 3.

Each of the redundant X decoders 5 has X3 to X10 of the row addresses input to it, the logic of X11 and X12 of row pre-decoder outputs being input as enabling logic to the redundant X decoder 5.

The logic of the X3 to X12 outputs of the row pre-decoder 4 is input to the X decoders (XDEC) 7 and performs selection of the main word line, and the logic of X0 to X2 is input to the memory array 1, and used to select the sub-word lines, 8 lines of which are provided for each main word line.

The address incrementing within the CBR counter 6 is performed once for each input of a refresh command.

When the output signal (the internal row address) of the switch 3 that is input to the redundant X decoders 5 coincides with the row redundancy address programmed within the redundant X decoders 5, all of the main word lines decoded by the X decoders 7 (XDEC) are deselected, and in their place, the redundant main word lines decoded by the redundant X decoders 5 are selected.

In the same manner, when the column address input to the redundant Y decoders 8 coincides with a column redundancy address that is programmed within the redundant Y decoders 8 in the manufacturing process, all of the column selection lines decoded by the Y decoders (YDEC) 9 become deselected, and in their place the redundancy column selection lines output from the redundant Y decoders 8 are selected.

The reference numeral 10 denotes an input/output circuit for the purpose of reading out data from the memory array 1 or writing data to the memory array 1.

In the process of repairing failed cells in the conventional semiconductor memory device configured as noted above, there is the problem that in the case in which all the redundant circuits are quickly used up in one segment, even if there are remaining usable redundant circuits in other segments, because the above-noted segment has used up all its redundant circuits, it becomes impossible to repair this semiconductor memory device.

In a method of repairing such a semiconductor memory device, there is the additional problem of increased chip cost, caused by the need to provide a greater number of redundant cells.

The Japanese Unexamined Patent Publication (KOKAI) No. 4-10297 has been proposed to improve the above-described problems. This Patent Publication describes that it is possible to reduce the chip surface area and reduce the cost by performing refresh of a specific cell having poor refresh characteristics more frequently than other cells.

The inventor of the present invention, taking note of the causes of failed cells, and in particular poor refresh characteristics, realized that if it were possible to improve the refresh characteristics of a failed cell and perform a refresh at a period that was shorter than the refresh period of a usual cell, it would be possible to repair more failed cells, this concept leading to the invention of a novel method of repairing failed cells.

Given the above, it is an object of the present invention to provide a novel semiconductor memory device and method for manufacturing same, which improves manufacturing yield, and which provides a further improvement in stable operation over what is described in the above-noted Patent Publication.

SUMMARY OF THE INVENTION

In order to achieve the above-noted objects, the present invention adopts the following basic technical constitution.

Specifically, the first aspect of the present invention is a semiconductor memory device having memory cells arranged in the form of an array, wherein a refresh period of a failed cell among the memory cells is shorter than that of a normal memory cell, the semiconductor memory device comprising: a control signal generated based on a refresh command for the purpose of performing a refresh of the memory cells; a counter for updating an internal address in accordance with the control signal; a refresh redundancy ROM having a plurality of switches and fuses arranged in the form of a matrix, and a judgment circuit, in which, of a plurality of fuses, a fuse corresponding to an internal row address of a memory cell having poor refresh characteristics is not cut; and a row pre-decoder, wherein when the row pre-decoder receives an internal row address generated in the counter, if the row pre-decoder receives a coincidence signal from the judgment circuit indicating that a fuse corresponding to the internal row address is not cut, the row pre-decoder sets the MSB of the internal row address output from the counter to be prescribed data.

The second aspect of the present invention is a semiconductor memory device having memory cells arranged in the form of an array, wherein a refresh period of a failed cell among the memory cells is shorter than that of a normal memory cell, the semiconductor memory device comprising: a control signal generated based on a refresh command for the purpose of performing a refresh of the memory cells;

a counter for updating an internal address in accordance with the control signal; a refresh redundancy ROM having a plurality of switches and fuses arranged in the form of a matrix, and a judgment circuit, in which, of a plurality of fuses, a fuse corresponding to an internal row address of a memory cell having poor refresh characteristics is cut; a latch for holding a coincidence signal which is output from the judgment circuit, when the judgment circuit detects that a fuse corresponding to an internal row address generated by the counter is cut; and a row pre-decoder, wherein when the row pre-decoder receives an internal row address generated by the counter, if the row pre-decoder receives a coincidence signal from the latch, the row pre-decoder sets the MSB of the internal row address output from the counter to be prescribed data.

The third aspect of the present invention is a semiconductor memory device having memory cells arranged in the form of an array, wherein a refresh period of a failed cell among the memory cells is shorter than that of a normal memory cell, the semiconductor memory device comprising: a control signal generated based on a refresh command for the purpose of performing a refresh of the memory cells; a counter for updating an internal address in accordance with the control signal; a refresh redundancy ROM having a plurality of switches and fuses arranged in the form of a matrix, and a judgment circuit, in which, of a plurality of fuses, a fuse corresponding to an internal row address of a memory cell having poor refresh characteristics is not cut; a holding circuit for holding a coincidence signal which is output from the judgment circuit, when the judgment circuit detects that a fuse corresponding to an internal row address generated by the counter is not cut; and a row pre-decoder, wherein when the row pre-decoder receives an internal row address generated by the counter, if the row pre-decoder receives a coincidence signal from the holding circuit, the row pre-decoder sets the MSB of the internal row address output from the counter to be prescribed data.

The fourth aspect of the present invention is a semiconductor memory device having memory cells arranged in the form of an array, wherein a refresh period of a failed cell among the memory cells is shorter than that of a normal memory cell, the semiconductor memory device comprising: a first refresh command; a second refresh command output immediately after the first refresh command; a control signal generated based on the refresh command for the purpose of refreshing the memory cells; a counter for updating an internal address in accordance with the control signal; a refresh redundancy ROM having a plurality of switches and fuses arranged in the form of a matrix, and a judgment circuit, in which a fuse corresponding to an internal row address immediately before an address of a memory cell having poor refresh characteristics is cut; a latch for latching a coincidence signal which is output from the judgment circuit, when the judgment circuit detects that a fuse corresponding to an internal row address generated by the counter in accordance with the first refresh command is cut; and a row pre-decoder, wherein when the row pre-decoder receives an internal row address generated by the counter based on the second refresh command, if the row pre-decoder receives a coincidence signal from the latch, the row pre-decoder sets the MSB of the internal row address output from the counter to be prescribed data.

The fifth aspect of the present invention is a semiconductor memory device having memory cells arranged in the form of an array, wherein a refresh period of a failed cell among the memory cells is shorter than that of a normal memory cell, the semiconductor memory device comprising: a first refresh command; a second refresh command output immediately after the first refresh command; a control signal generated based on the refresh command for the purpose of refreshing the memory cells; a counter for updating an internal address in accordance with the control signal; a refresh redundancy ROM having a plurality of switches and fuses arranged in the form of a matrix, and a judgment circuit, in which a fuse corresponding to an internal row address immediately before an address of a memory cell having poor refresh characteristics is not cut; a latch for latching a coincidence signal which is output from the judgment circuit, when the judgment circuit detects that a fuse corresponding to an internal row address generated by the counter in accordance with the first refresh command is not cut; and a row pre-decoder, wherein when the row pre-decoder receives an internal row address generated by the counter based on the second refresh command, if the row pre-decoder receives a coincidence signal from the latch, the row pre-decoder sets the MSB of the internal row address output from the counter to be prescribed data.

The sixth aspect of the present invention is a semiconductor memory device having memory cells arranged in the form of an array, wherein a refresh period of a failed cell among the memory cells is shorter than a refresh period of a normal cell, the semiconductor memory device comprising: a control signal generated based on a refresh command for the purpose of performing a refresh of the memory cells; a counter for updating an internal address in accordance with the control signal; a decoder for decoding a row address; and a row pre-decoder; wherein the decoder having a fuse ROM which indicates a memory cell having poor refresh characteristics; an AND circuit for taking the logical AND of a signal from the fuse ROM and the control signal; an OR circuit for taking the logical OR of a signal from the AND circuit and the MSB of an internal row address output from the counter; and an AND circuit for taking the logical AND of pre-decoded signals from the row pre-decoder and a signal from the OR circuit.

The seventh aspect of the present invention is a method for manufacturing a semiconductor memory comprising the steps of: repairing a failed cell by using either row redundancy or column redundancy; and repairing remaining failed cells that cannot be repaired by the first repairing step by increasing the number of refreshes of the failed cell greater than that of normal cell.

BRIEF DESCRIPTION OF THE DRAWINGS

FIG. 6 is a timing diagram showing the operation of the third embodiment of the present invention.

FIG. 7 is a block diagram showing the configuration of a fourth embodiment of the present invention.

DETAILED DESCRIPTION OF THE PREFERRED EMBODIMENTS

A semiconductor memory device according to the present invention first performs repair of failed cells by row redundancy, namely, replacement of a row containing a failed cell with a redundant row, and column redundancy, namely, replacement of a column containing a failed cell with a redundant column (hereinafter referred to as "separate repair" in this specification) and, if there are failed cells remaining that cannot be repaired using row redundancy and column redundancy, the present invention shortens the refresh period of failed cells so as to be shorter than the refresh period of normal cells (this repair being hereinafter referred to as "refresh repair" in this specification), thereby enabling improvement in manufacturing yield without an increase of the chip surface area.

Figure 9:
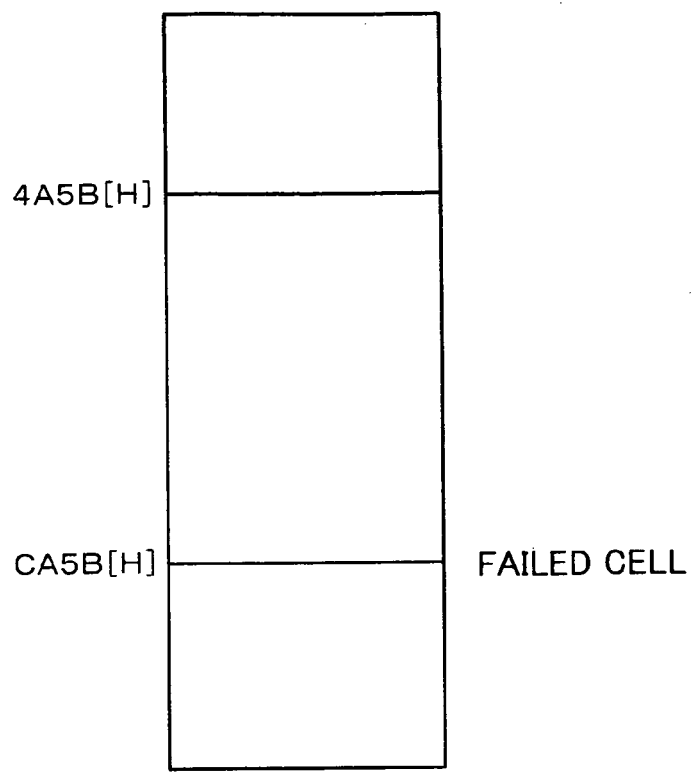
FIG. 9 is a drawing illustrating the present invention.

For example, in FIG. 9, there is a failed cell at the address CA5Bh (hexadecimal representation). In this case, when refreshing the normal cell at the address 4A5Bh that has the same address other than the MSB of the failed cell address CA5Bh, simultaneously refreshing the failed cell at the address CA5Bh, the refresh period of the failed cell at the address CA5Bh is made ½ of the normal cells, thereby repairing the failed cell.

In the same manner, when refreshing the cells at the addresses 0A5Bh, 4A5Bh, 8A5bh, CA5Bh, which are the same address other than 2 bits of the MSB of the filed cell address CA5Bh if refreshing the failed cell at the address CA5Bh simultaneously, the refresh period of the failed cell is made ¼ of the normal cells, thereby enabling repair of failed cells having even worse characteristics.

Figure 10:
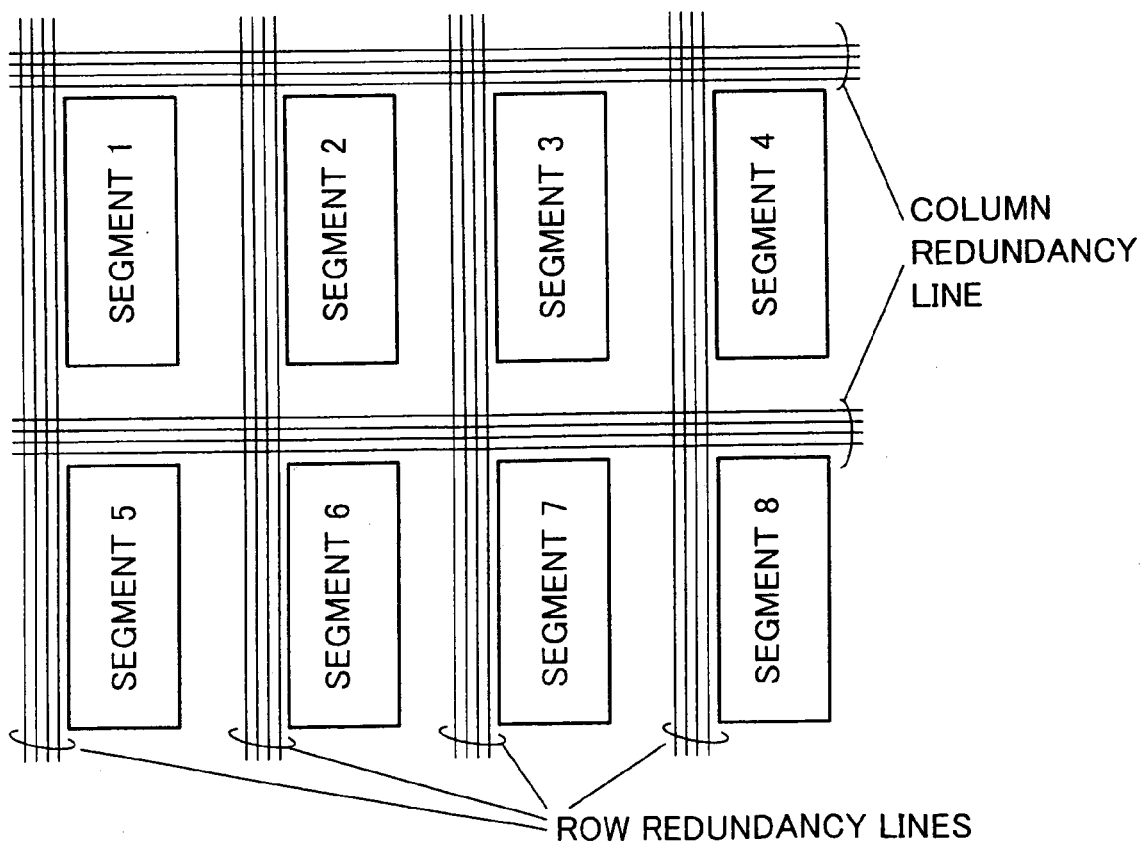
FIG. 10 is a drawing illustrating the present invention.

FIG. 10 is a drawing illustrating a repair method of the present invention.

In FIG. 10, row redundancy of four sets are provided in common for segments 1 and 5, four sets are provided in common for segments 2 and 6, four sets are provided in common for segments 3 and 7, and four sets are provided in common for segments 4 and 8, and column redundancy of four sets are provided in common for segments 1 to 4 and four sets are provided in common for segments 5 to 8.

For example, in a refresh test, if it is not possible to repair a failure within segment 1 and it is possible to repair a failure in segments 2 to 8, in the past this chip under the refresh test would have been judged to be a bad device.

In the present invention, however, the segments 2 to 8 are repaired using row redundancy or column redundancy, and for the failed cells remaining that were not repairable by row redundancy or column redundancy, the refresh period of the remaining failed cell is made short using "refresh repair", thereby enabling a chip that would have been classed as failed in the past to be a good chip.

When this is done, because the number of cells repaired by refresh repair is held to the minimum, it is possible to minimize an increase in current caused by refresh repair of the present invention.

"Refresh repair" performed in the present invention is described more specifically in terms of embodiments presented below.

The First Embodiment

Figure 1:
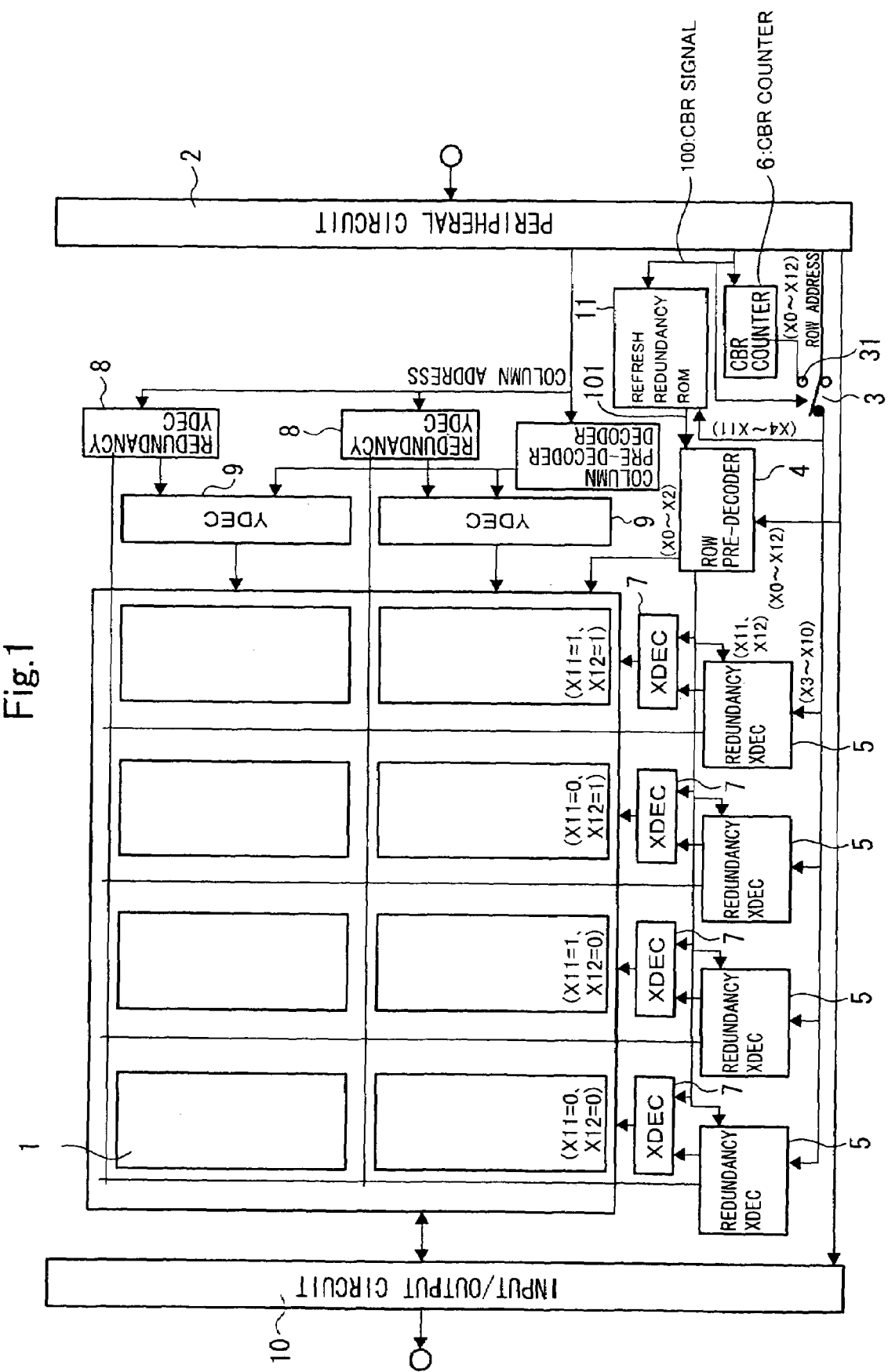
FIG. 1 is a block diagram showing the configuration of the first embodiment of the present invention.
Figure 2A:
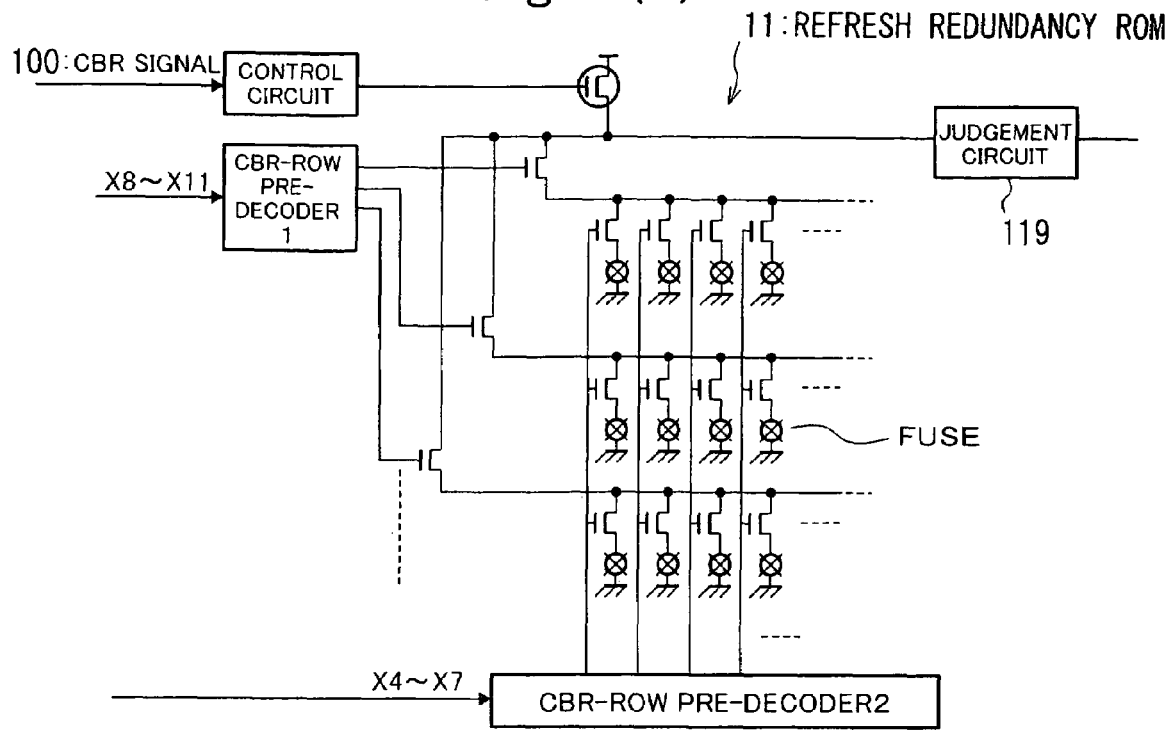
FIG. 2(a) and FIG. 2(b) are drawings showing the detailed configuration of a refresh redundancy ROM of a first embodiment of the present invention.
Figure 2B:
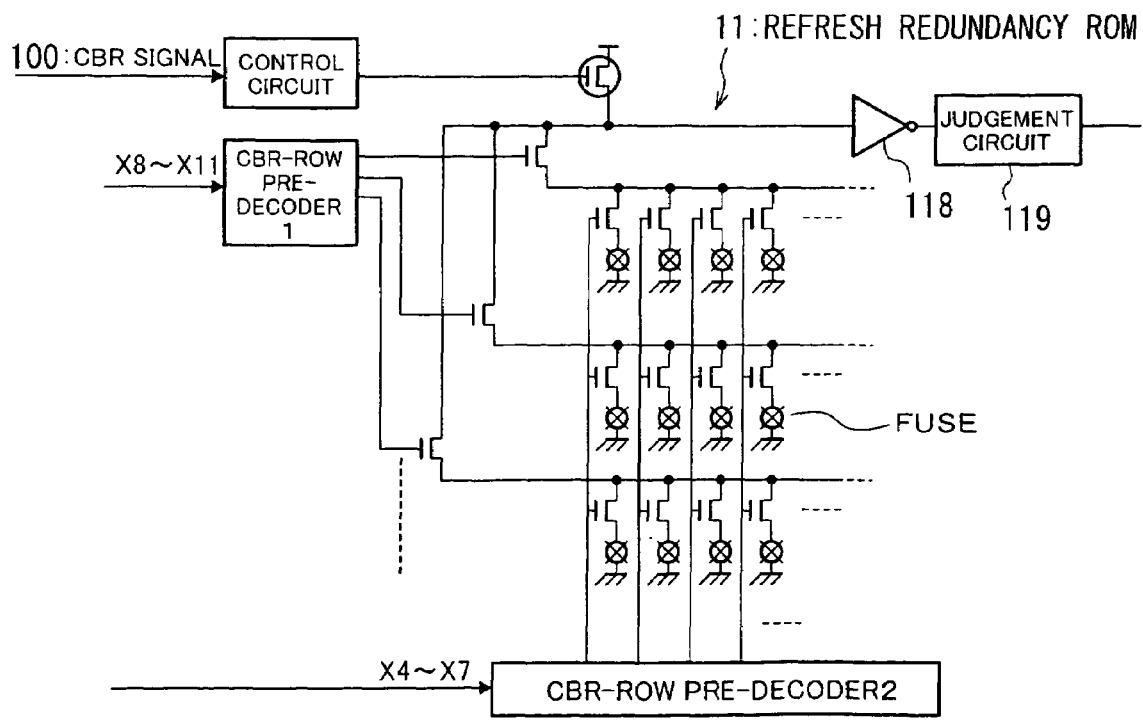
Figure 3:
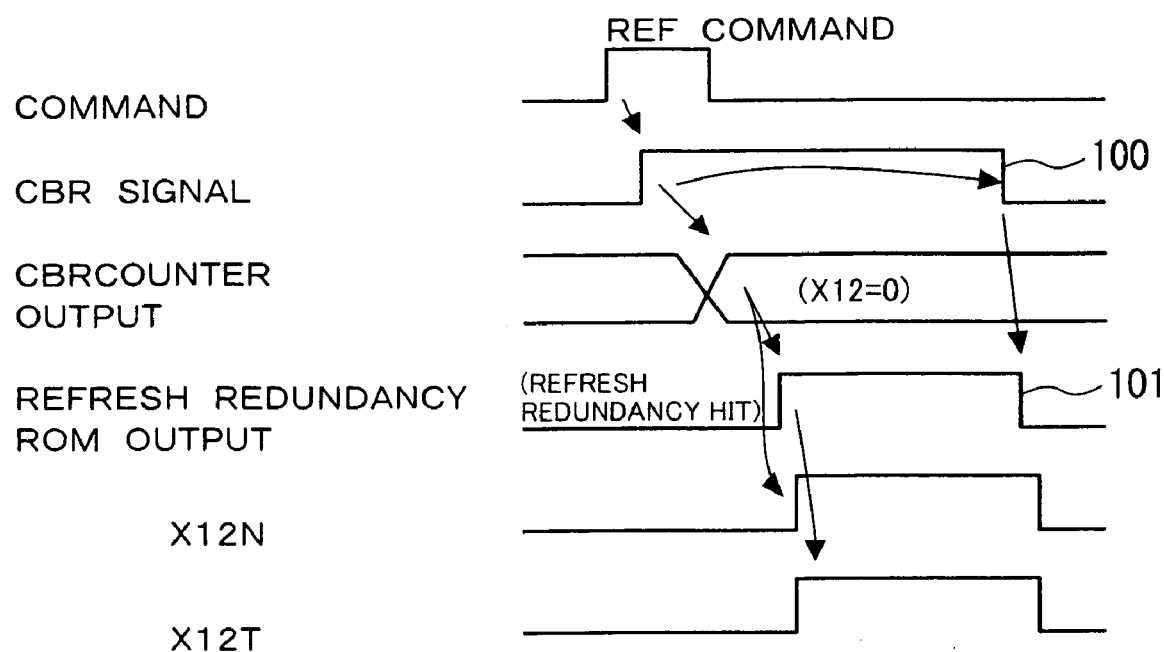
FIG. 3 is a timing diagram showing the operation of the first embodiment of the present invention.

FIG. 1 to FIG. 3 are drawings showing the first embodiment of the present invention, FIG. 1 being a block diagram showing the configuration of the first embodiment, FIG. 2 being a drawing showing the detailed configuration of the refresh redundancy ROM, and FIG. 3 being a timing diagram showing the operation of the first embodiment.

Figure 11:
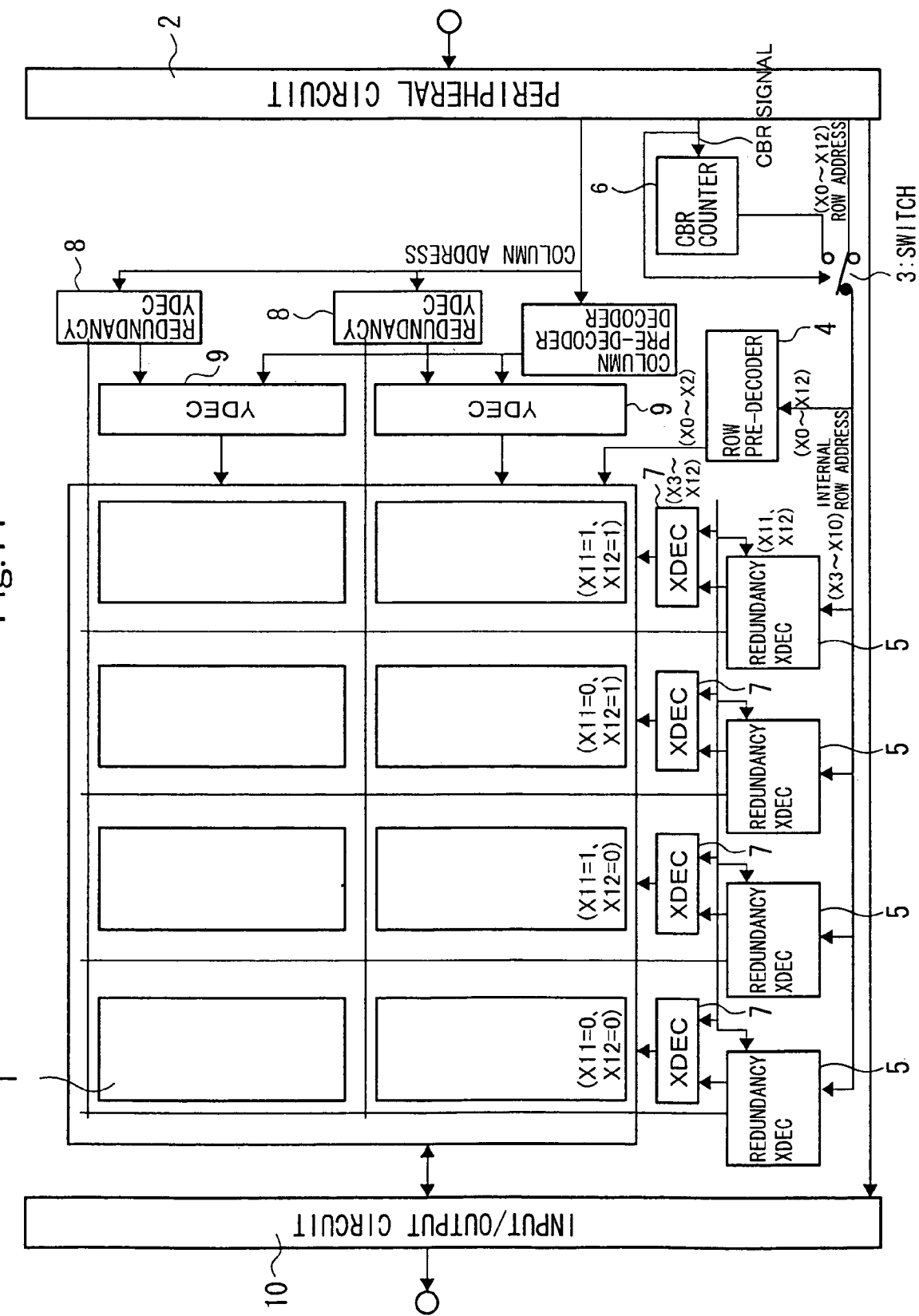
FIG. 11 is a block diagram showing the configuration of a conventional semiconductor memory device.

The difference between the circuit blocks between FIG. 1 and FIG. 11 is that the first embodiment includes the refresh redundancy ROM 11. Other aspects of the configuration, however, are the same as the past example shown in FIG. 11. Accordingly, the same reference numerals have been applied to corresponding parts, which are not described in detail herein.

FIG. 2(*a*) is a drawing showing the configuration of the refresh redundancy ROM 11 in the first embodiment which is formed by MOS switches and fuses arranged in the form of a matrix and a judgment circuit 119, wherein redundancy cell addresses are programmed so that fuses corresponding to row addresses of cells having poor refresh characteristics are cut. When coincidence occurs between an internal address from the CBR counter 6 and a programmed address within the refresh redundancy ROM 11, the judgment circuit 119 outputs the coincidence pulse 101 for a prescribed amount of time, as shown in FIG. 3.

In a semiconductor memory device configured as described above, when a REF command is input, because the switch 3 is connected to the contact 31 thereof, the internal row address generated within the CBR counter 6 is input to the refresh redundancy ROM 11 and the row pre-decoder 4.

In the refresh redundancy ROM 11, if a fuse corresponding to the internal row address generated by the CBR counter 6 is cut and the judgment circuit 119 of the refresh redundancy ROM 11 detects that a fuse corresponding to the internal row address generated by the CBR counter 6 is cut, the refresh redundancy ROM 11 outputs the coincidence pulse 101.

When the row pre-decoder 4 receives the internal address signals X0 through X12 from the CBR counter 6, if the output from the refresh redundancy ROM 11 is at the high level, the row pre-decoder 4 sets the MSB of the internal row address output from the CBR counter 6 to be a high level, as shown in FIG. 3. That is, by making both the X12T and X12N signals of the MSB high level as shown in FIG. 3, the entire memory arrays are selected. In this case, therefore, because all cells having the same address except for the MSB are refreshed simultaneously, the refresh period of a failed cell is made ½ of the refresh period of a normal cell, so that the number of refreshes of a failed cell is 2 times the number of refreshes of a normal cell, and this embodiment thus enables the repair of failed cells by increasing the number of refreshes of failed cells having poor refresh characteristics. FIG. 3 illustrates a timing diagram showing the above-mentioned operation of the first embodiment.

In the above description, although the internal address is updated by the CBR counter 6 counting up as described in the prior art, however, it is possible to adopt a configuration in which the internal address is updated by the CBR counter 6 counting down.

Additionally, in the above description, the fuses of the refresh redundancy ROM 11 corresponding to row addresses having poor refresh characteristics are cut, and in this case if the cutting of a particular fuse is not done successfully, the chip would be judged to be bad.

This problem can be eliminated, as shown in FIG. 2(*b*), by adopting a configuration in which only fuses of the refresh redundancy ROM corresponding to a row address having poor refresh characteristics are uncut. In this case, if it was not possible to cut a given fuse, although the number of refreshes for that cell will increase, the problem of erroneously judging the chip to be bad is prevented.

In FIG. 2(b), an inverter 118 is provided in the input of the judgment circuit 119.

As described above, the first embodiment of the present invention is a semiconductor memory device having memory cells arranged in the form of an array, wherein a refresh period of a failed cell is shorter than that of a normal memory cell, this semiconductor memory device including: a control signal 100 generated based on a refresh command for the purpose of performing a refresh of the memory cells; a counter 6 for updating an internal address in accordance with the control signal 100; a refresh redundancy ROM 11 having a plurality of switches and fuses arranged in the form of a matrix, and a judgment circuit 119, in which, of a plurality of fuses, a fuse corresponding to an internal row address of a memory cell having poor refresh characteristics is not cut; and a row pre-decoder 4, wherein when the row pre-decoder 4 receives an internal row address generated in the counter 6, if the row pre-decoder 4 receives a coincidence signal 101 from the judgment circuit 119 indicating that a fuse corresponding to the internal row address is not cut, the row pre-decoder 4 sets the MSB of the internal row address output from the counter to be prescribed data.

The Second Embodiment

Figure 4:
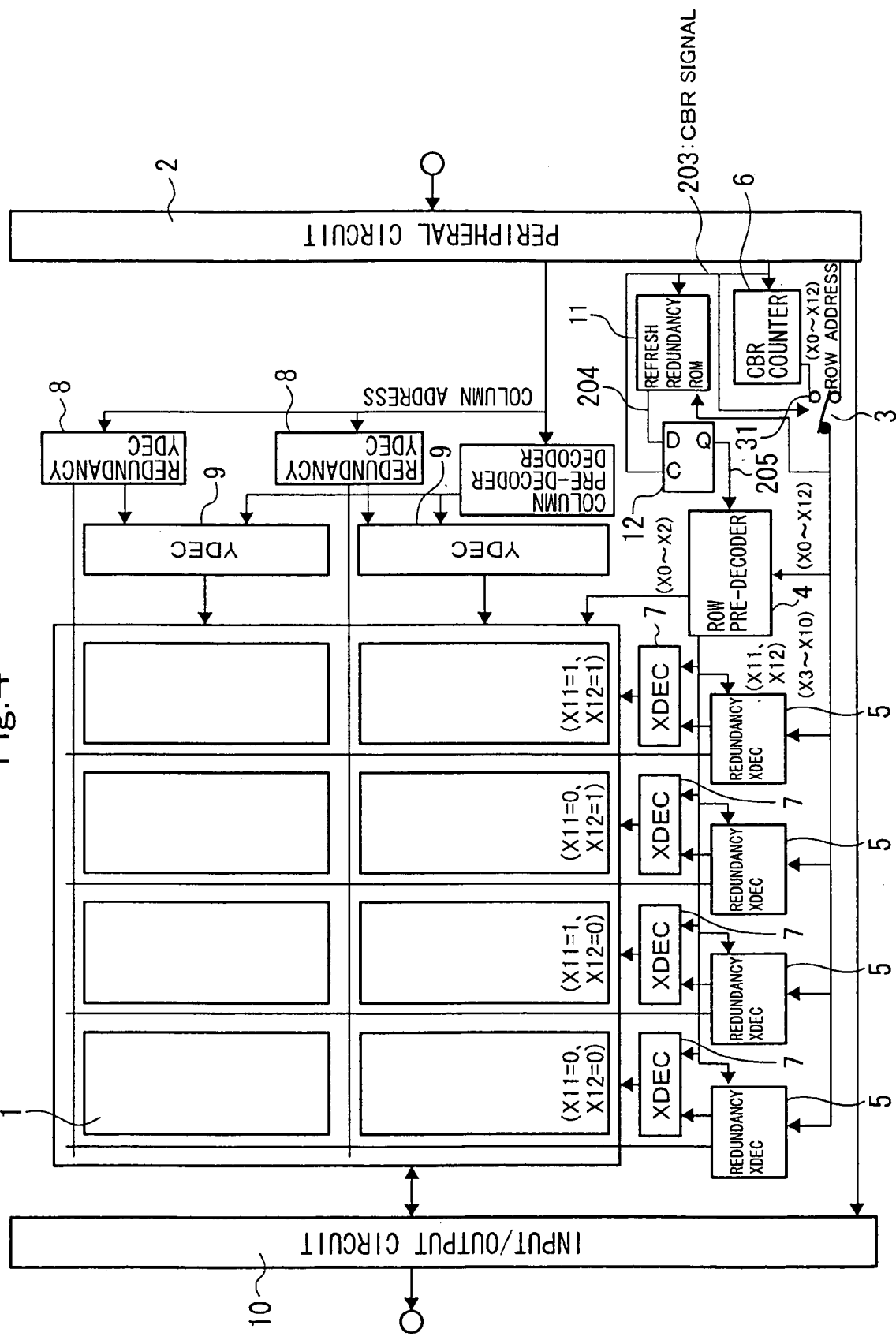
FIG. 4 is a block diagram showing the configuration of second and third embodiments of the present invention.

The second embodiment of the present invention is described below with reference made to FIG. 2, FIG. 4 and FIG. 5, FIG. 4 being a block diagram showing the second embodiment, and FIG. 5 being a timing diagram showing the operation of the second embodiment.

The second embodiment differs from the first embodiment in that a D-type flip-flop 12 is provided, which latches the output of the refresh redundancy ROM 11.

In this case, it is also possible to use another type of holding circuit in place of the D-type flip-flop 12, as long as it enables the latching of the output of the refresh redundancy ROM 11.

Figure 5:
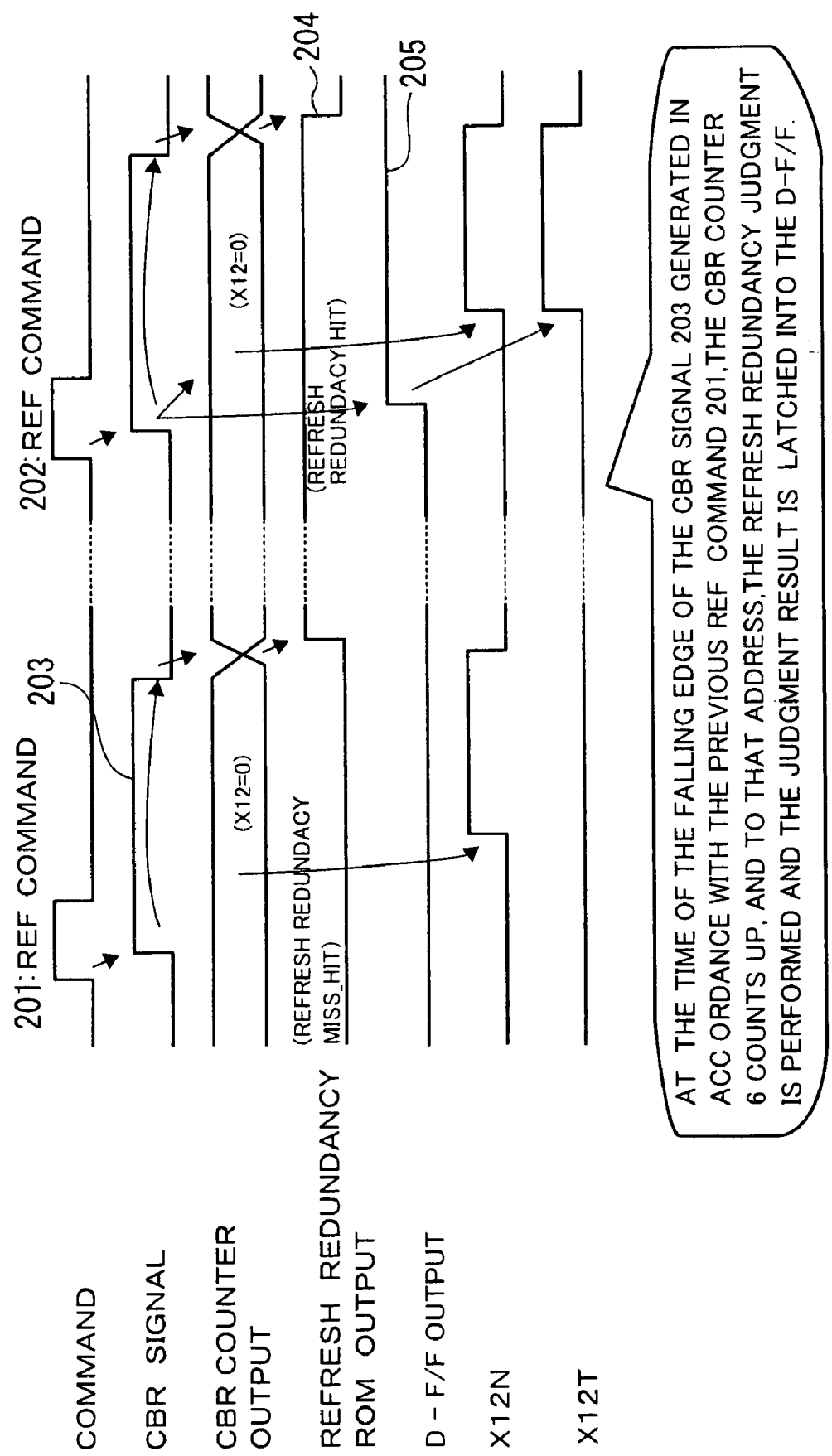
FIG. 5 is a timing diagram showing the operation of the second embodiment of the present invention.

In the second embodiment, as shown in FIG. 5, when the CBR signal 203 of the immediately previous REF command 201 is reset, the CBR counter 6 counts up, a refresh redundancy judgment being made in advance at this address and, if there is coincidence, a coincidence pulse 204 is output from the refresh redundancy ROM 11, this data being held in the D-type flip-flop 12.

In the second embodiment, because a refresh redundancy judgment has already been completed at the time of the input of a REF command 202 for the refreshing of a next cell, it is possible to achieve stable operation without causing a problem in the speed of generating a row address.

As described above, the second embodiment of the present invention is a semiconductor memory device having memory cells arranged in the form of an array, wherein a refresh period of a failed cell is shorter than that of a normal memory cell, this semiconductor memory device including: a control signal 203 generated based on a refresh command for the purpose of performing are fresh of the memory cells; a counter 6 for updating an internal address in accordance with the control signal 203; a refresh redundancy ROM 11 having a plurality of switches and fuses arranged in the form of a matrix, and a judgment circuit 119, in which, of a plurality of fuses, a fuse corresponding to an internal row address of a memory cell having poor refresh characteristics is cut; a latch 12 for holding a coincidence signal 204 which is output from the judgment circuit 119, when the judgment circuit 119 detects that a fuse corresponding to an internal row address generated by the counter is cut; and a row pre-decoder 4, wherein when the row pre-decoder 4 receives an internal row address generated by the counter 6, if the row pre-decoder 4 receives a coincidence signal 205 from the latch 12, the row pre-decoder 4 sets the MSB of the internal row address output from the counter to be prescribed data.

Additionally, in the above description, the fuses of the refresh redundancy ROM 11 corresponding to row addresses having poor refresh characteristics are cut, it is also possible to adopt the configuration shown in FIG. 2(b), in which, as described in the first embodiment, of a plurality of fuses, fuses of the refresh redundancy ROM 11 corresponding to row addresses having poor refresh characteristics are not cut.

It is therefore possible to configure the second embodiment as follows.

The aspect of the second embodiment is a semiconductor memory device having memory cells arranged in the form of an array, wherein a refresh period of a failed cell is shorter than that of a normal memory cell, this semiconductor memory device including: a control signal 203 generated based on a refresh command for the purpose of performing a refresh of the memory cells; a counter 6 for updating an internal address in accordance with the control signal 203; a refresh redundancy ROM 11 having a plurality of switches and fuses arranged in the form of a matrix, and a judgment circuit 119, in which, of a plurality of fuses, a fuse corresponding to an internal row address of a memory cell having poor refresh characteristics is not cut; a holding circuit 12 for holding a coincidence signal 204 which is output from the judgment circuit 119, when the judgment circuit 119 detects that a fuse corresponding to an internal row address generated by the counter is not cut; and a row pre-decoder 4, wherein when the row pre-decoder 4 receives an internal row address generated by the counter 6, if the row pre-decoder 4 receives a coincidence signal 205 from the holding circuit 12, the row pre-decoder 4 sets the MSB of the internal row address output from the counter to be prescribed data.

A feature of the second embodiment is that the counter 6 is updated at the trailing edge of the control signal 203 which is generated based on a refresh command 201, which is output immediately before the refresh command 202, and in synchronization with this updating, the judgment circuit 119 outputs the coincidence signal 204 and the coincidence signal 204 is latched by the latch 12.

The Third Embodiment

FIG. 6 is a timing diagram showing the operation of the third embodiment.

The semiconductor memory device according to the third embodiment provided with a D-type flip-flop 12 that latches the output of the refresh redundancy ROM 11.

The third embodiment differs from the second embodiment in that the address programmed into the refresh redundancy ROM 11 is the address immediately before the address of the cell which is to be repaired by "refresh repair" of the present invention.

Specifically, in the case of FIG. 9, since the address of the failed cell is CA5Bh, the programmed address is CA5Ah.

That is, in the third embodiment, when the REF command 201 is output, a judgment is made as to whether a memory cell at the address corresponding to the next REF command 202 is to be repaired by "refresh repair" and a coincidence signal 204A is latched by the D-type flip-flop 12. In this embodiment, when the REF command 202 for refreshing a cell is input, the refresh redundancy repair judgment has already been made, it is possible to achieve stable operation without causing a problem in the speed of generating a row address.

The third embodiment is described below, with reference made to FIG. 6.

In the third embodiment, as shown in FIG. 6, after the rising edge of the CBR signal 203 at the previous REF command 201, the CBR counter 6 counts up. Then, because the address immediately before the failed cell address is not programmed into the refresh redundancy ROM 11, when the judgment circuit 119 detects that a fuse corresponding to an internal row address generated with the CBR counter 6 is cut, it outputs the coincidence signal 204A, this coincidence signal 204A serving as the control signal for the next refresh. The coincidence signal 204A is latched by the D-type flip-flop 12, which outputs the coincidence signal 205.

When the next refresh command 202 is output, the row pre-decoder 4 again receives the internal address signals X0 to X12 which are counted up by the CBR counter 6. When this occurs, if the output of the D-type flip-flop 12 is at the high level, the row pre-decoder 4 enables the uppermost-order bit output from the CBR counter 6. That is, by enabling both the X12T and the X12N signal lines of the uppermost-order bit, all of the memory array is selected. In this case, because cells having the same addresses with the exception of the uppermost-order bit are simultaneously refreshed, it is possible to control the refresh period of failed cells so that the refresh period of the failed cell is made ½ of the normal cells.

It is therefore possible to configure the third embodiment as follows.

The aspect of the third embodiment is a semiconductor memory device having a plurality of segments, each segment having memory cells arranged in the form of an array, wherein a refresh period of a failed cell among said memory cells is shorter than that of a normal memory cell, this semiconductor memory device including: a first refresh command 201; a second refresh command 202 output immediately after the first refresh command 201; a control signal 203 generated based on the refresh commands 201 and 202 for the purpose of refreshing the memory cells; a counter 6 for updating an internal address in accordance with the control signal 203; a refresh redundancy ROM 11 formed by a plurality of switches and fuses arranged in the form of a matrix, and a judgment circuit 119, in which a fuse corresponding to the internal row address immediately before the address of a cell having poor refresh characteristics is cut; a latch 12 for latching a coincidence signal 204 which is output from the judgment circuit 119, when the judgment circuit 119 detects that a fuse corresponding to an internal row address generated by the counter 6 in accordance with the first refresh command 201 is cut; and a row pre-decoder 4, wherein when the row pre-decoder 4 receives an internal row address generated by the counter 6 based on the second refresh command 202, if the row pre-decoder 4 receives a coincidence signal 205 from the latch 12, the row pre-decoder 4 sets the MSB of the internal row address output from the counter to be prescribed data.

As shown in FIG. 2(b), it is therefore possible to configure the third embodiment as follows.

The another aspect of the third embodiment is a semiconductor memory device having a plurality of segments, each segment having memory cells arranged in the form of an array, wherein a refresh period of a failed cell among said memory cells is shorter than that of a normal memory cell, this semiconductor memory device including: a first refresh command 201; a second refresh command 202 output immediately after the first refresh command 201; a control signal 203 generated based on the refresh commands 201 and 202 for the purpose of refreshing the memory cells; a counter 6 for updating an internal address in accordance with the control signal 203; a refresh redundancy ROM 11 formed by a plurality of switches and fuses arranged in the form of a matrix, and a judgment circuit 119, in which a fuse corresponding to the internal row address immediately before the address of a cell having poor refresh characteristics is not cut; a latch 12 for latching a coincidence signal 204 which is output from the judgment circuit 119, when the judgment circuit 119 detects that a fuse corresponding to an internal row address generated by the counter 6 in accordance with the first refresh command 201 is not cut; and a row pre-decoder 4, wherein when the row pre-decoder 4 receives an internal row address generated by the counter 6 based on the second refresh command 202, if the row pre-decoder 4 receives a coincidence signal 205 from the latch 12, the row pre-decoder 4 sets the MSB of the internal row address output from the counter to be prescribed data.

The Fourth Embodiment

Figure 8A:
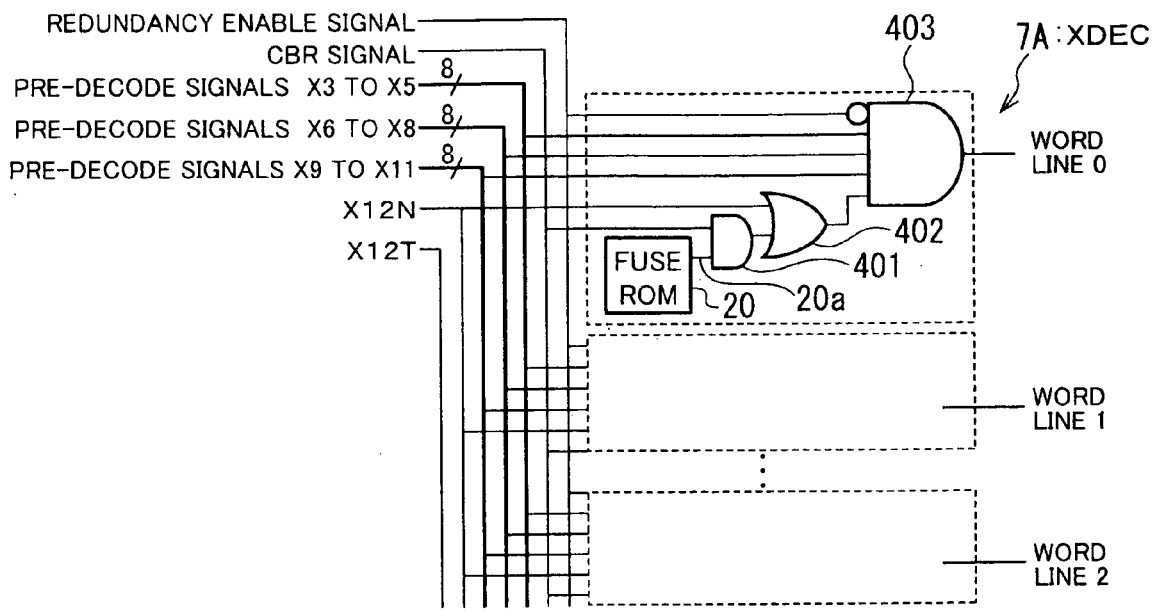
FIG. 8(a) is a block diagram showing the configuration of the X decoder (XDEC) of the fourth embodiment of the present invention.
Figure 8B:
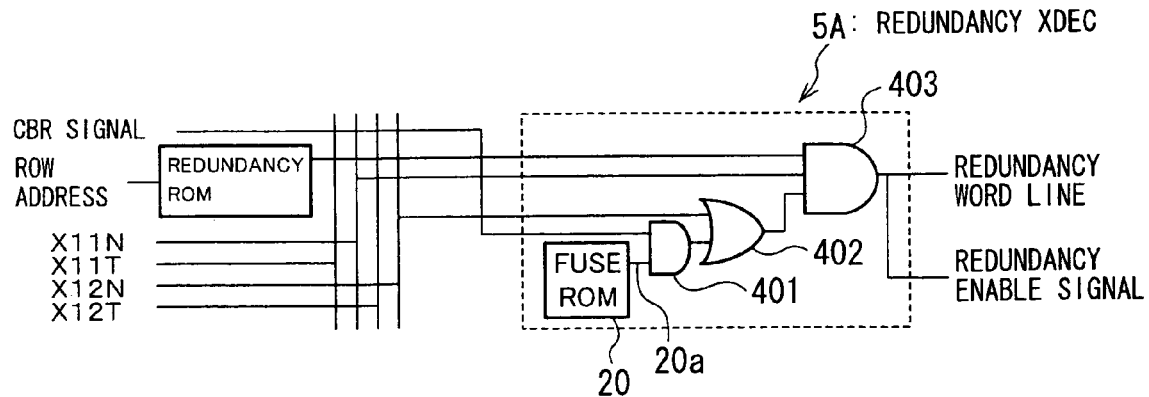
FIG. 8(*b*) is a block diagram showing the configuration of the redundant X decoder of the fourth embodiment of the present invention.

FIG. 7 and FIG. 8 are block diagrams showing the fourth embodiment of the present invention.

The fourth embodiment is provided with a fuse ROM 20 for refresh redundancy repair within each X decoder 5A and X decoder 7A.

That is, one fuse ROM 20, into which data is written to invalidate the decoding of the MSB of X address (in this embodiment, X12), is disposed for each main word line (or plurality of lines).

Therefore, in FIG. 8, in the case in which there is nothing written into the fuse ROM, a word line decoded based on the pre-decoded signals X3 to X11 output from the CBR counter 6 and X12N (or X12T) is selected, and refreshing is performed.

If, however, data indicating refresh repair is written into the fuse ROM 20 of FIG. 8, the decoding of the MSB of X address is made invalid.

A redundancy enable signal is output from the redundancy X decoder 5A and this signal is input to the X decoder 7A. Therefore, when this redundancy enable signal is output to the X decoder 7A, the decoding by the X decoder 7A is stopped.

In the above-noted configuration, the fuses of the redundancy X decoder 7A are cut, and in this case if the cutting of a particular fuse is not done successfully, the chip would be judged to be bad.

This problem can be eliminated by adopting a configuration in which only fuses of word lines of failed cells having poor refresh characteristics are not cut. In this case, if it was not possible to cut a given fuse, although the number of refreshes for that cell will increase, the problem of erroneously judging the chip to be bad is prevented.

It is therefore possible to configure the fourth embodiment as follows.

The aspect of the fourth embodiment is a semiconductor memory device having memory cells arranged in the form of an array, wherein a refresh period of a failed cell among the memory cells is shorter than a refresh period of a normal cell, the semiconductor memory device comprising: a control signal 100 generated based on a refresh command for the purpose of performing a refresh of the memory cells; a counter 6 for updating an internal address in accordance with the control signal 100; a decoder 5A for decoding a row address; a row pre-decoder 4; wherein the decoder 5A having a fuse ROM 20 which indicates a cell having poor refresh characteristics; an AND circuit 401 for taking the logical AND of a signal from the fuse ROM 20 and the control signal 100; an OR circuit 402 for taking the logical OR of a signal from the AND circuit 401 and the MSB of an internal row address output from the counter 6; and an AND circuit 403 for taking the logical AND of pre-decoded signals X3–X11 from the row pre-decoder 4 and a signal from the OR circuit 402.

In this embodiment as well, it is possible to adopt an alternative configuration in which the decoding of the uppermost-order 2 bits or 3 bits is disabled.

A semiconductor memory device according to the present invention, at first, failed cells are repaired using row redundancy or column redundancy as done in the past and then, for the remaining failed cells that cannot be repaired by row or column redundancy, by increasing the number of refreshes greater than that of normal cells, it is possible to repair more failed cells. The present invention can therefore increase manufacturing yield, without an increase of the chip surface area.

What is claimed is:

1. A semiconductor memory device having memory cells arranged in the form of an array, wherein a refresh period of a failed cell among said memory cells is shorter than that of a normal memory cell, said semiconductor memory device comprising:
   a control signal generated based on a refresh command for the purpose of performing a refresh of said memory cells;
   a counter for updating an internal row address generated by said counter in accordance with the control signal;
   a refresh redundancy ROM having a plurality of switches and fuses arranged in the form of a matrix, and a judgment circuit, in which, of a plurality of fuses, a fuse corresponding to an internal row address of a memory cell having poor refresh characteristics is not cut; and
   a row pre-decoder, wherein when said row pre-decoder receives said internal row address generated by said counter, if said row pre-decoder receives a coincidence signal from said judgment circuit indicating that said fuse corresponding to said internal row address of said memory cell is not cut, said row pre-decoder sets the MSB of said internal row address generated by said counter to be prescribed data.

2. A semiconductor memory device having memory cells arranged in the form of an array, wherein a refresh period of a failed cell among said memory cells is shorter than that of a normal memory cell, said semiconductor memory device comprising:
   a control signal generated based on a refresh command for the purpose of performing a refresh of said memory cells;
   a counter for updating an internal row address generated by said counter in accordance with the control signal;
   a refresh redundancy ROM having a plurality of switches and fuses arranged in the form of a matrix, and a judgment circuit, in which, of a plurality of fuses, a fuse corresponding to an internal row address of a memory cell having poor refresh characteristics is cut;
   a latch for holding a coincidence signal which is output from said judgment circuit, when said judgment circuit detects that a fuse corresponding to said internal row address generated by said counter is cut; and
   a row pre-decoder, wherein when said row pre-decoder receives said internal row address generated by said counter, if said row pre-decoder receives said coincidence signal from said latch, said row pre-decoder sets the MSB of said internal row address generated by said counter to be prescribed data.

3. The semiconductor memory device according to claim 2, wherein said counter is updated at a falling edge of said control signal and in synchronization with the updating, said judgment circuit outputs said coincidence signal and said coincidence signal is latched by said latch.

4. The semiconductor memory device according to claim 1, wherein said row pre-decoder sets the two uppermost-order bits of said internal row address generated by said counter to be prescribed data.

5. A semiconductor memory device having memory cells arranged in the form of an array, wherein a refresh period of a failed cell among said memory cells is shorter than that of a normal memory cell, said semiconductor memory device comprising:
   a control signal generated based on a refresh command for the purpose of performing a refresh of said memory cells;
   a counter for updating an internal row address generated by said counter in accordance with the control signal;
   a refresh redundancy ROM having a plurality of switches and fuses arranged in the form of a matrix, and a judgment circuit, in which, of a plurality of fuses, a fuse corresponding to an internal row address of a memory cell having poor refresh characteristics is not cut;
   a holding circuit for holding a coincidence signal which is output from said judgment circuit, when said judgment circuit detects that a fuse corresponding to said internal row address generated by said counter is not cut; and
   a row pre-decoder, wherein when said row pre-decoder receives said internal row address generated by said counter, if said row pre-decoder receives said coincidence signal from said holding circuit, said row pre-decoder sets the MSB of said internal row address generated by said counter to be prescribed data.

6. A semiconductor memory device having memory cells arranged in the form of an array, wherein a refresh period of a failed cell among said memory cells is shorter than that of a normal memory cell, said semiconductor memory device comprising:
   a first refresh command;
   a second refresh command output immediately after the first refresh command;
   a control signal generated based on said refresh command for the purpose of refreshing said memory cells;
   a counter for updating an internal row address generated by said counter in accordance with the control signal;
   a refresh redundancy ROM having a plurality of switches and fuses arranged in the form of a matrix, and a judgment circuit, in which a fuse corresponding to an internal row address immediately before an address of a memory cell having poor refresh characteristics is cut;
   a latch for latching a coincidence signal which is output from said judgment circuit, when said judgment circuit detects that a fuse corresponding to said internal row address generated by said counter in accordance with the first refresh command is cut; and
   a row pre-decoder, wherein when said row pre-decoder receives said internal row address generated by said counter based on the second refresh command, if said row pre-decoder receives said coincidence signal from said latch, said row pre-decoder sets the MSB of said internal row address generated by said counter to be prescribed data.

7. A semiconductor memory device having memory cells arranged in the form of an array, wherein a refresh period of a failed cell among said memory cells is shorter than that of a normal memory cell, said semiconductor memory device comprising:
- a first refresh command;
- a second refresh command output immediately after the first refresh command;
- a control signal generated based on said refresh command for the purpose of refreshing said memory cells;
- a counter for updating an internal row address generated by said counter in accordance with the control signal;
- a refresh redundancy ROM having a plurality of switches and fuses arranged in the form of a matrix, and a judgment circuit, in which a fuse corresponding to an internal row address immediately before an address of a memory cell having poor refresh characteristics is not cut;
- a latch for latching a coincidence signal which is output from said judgment circuit, when said judgment circuit detects that a fuse corresponding to said internal row address generated by said counter in accordance with the first refresh command is not cut; and
- a row pre-decoder, wherein when said row pre-decoder receives said internal row address generated by said counter based on the second refresh command, if said row pre-decoder receives said coincidence signal from said latch, said row pre-decoder sets the MSB of said internal row address generated by said counter to be prescribed data.

8. A semiconductor memory device having memory cells arranged in the form of an array, wherein a refresh period of a failed cell among said memory cells is shorter than a refresh period of a normal cell, said semiconductor memory device comprising:
- a control signal generated based on a refresh command for the purpose of performing a refresh of said memory cells;
- a counter for updating an internal row address generated by said counter in accordance with the control signal;
- a decoder for decoding a row address; and
- a row pre-decoder; wherein said decoder having a fuse ROM which indicates a memory cell having poor refresh characteristics;
- an AND circuit for taking the logical AND of a signal from said fuse ROM and said control signal;
- an OR circuit for taking the logical OR of a signal from said AND circuit and the MSB of said internal row address generated by said counter; and
- an AND circuit for taking the logical AND of pre-decoded signals from said row pre-decoder and a signal from said OR circuit.

9. A method for manufacturing a semiconductor memory comprising the steps of:
- providing a control signal generated based on a refresh command for the purpose of performing a refresh of one or more memory cells;
- providing a counter for updating an internal row address generated by said counter in accordance with the control signal;
- providing a refresh redundancy ROM having a plurality of switches and fuses arranged in the form of a matrix, and a judgment circuit, in which, of a plurality of fuses, a fuse corresponding to an internal row address of a memory cell having poor refresh characteristics is not cut;
- providing a row pre-decoder, wherein when said row pre-decoder receives said internal row address generated by said counter, if said row pre-decoder receives a coincidence signal from said judgment circuit indicating that said fuse corresponding to said internal row address of said memory cell is not cut, said row pre-decoder sets the MSB of said internal row address generated by said counter to be prescribed data;
- repairing one or more of a plurality of failed cells by using either row redundancy or column redundancy; and
- repairing one or more of a plurality of failed cells that were not repaired by said first repairing step by increasing the number of refreshes of a failed cell greater than that of a normal cell.

* * * * *